United States Patent
Parikh et al.

(10) Patent No.: US 7,074,626 B2
(45) Date of Patent: Jul. 11, 2006

(54) METHOD AND APPARATUS FOR PROVIDING INTRA-TOOL MONITORING AND CONTROL

(75) Inventors: Suketu Parikh, San Jose, CA (US); Robin Cheung, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 81 days.

(21) Appl. No.: 10/804,324

(22) Filed: Mar. 19, 2004

(65) Prior Publication Data

US 2004/0173464 A1    Sep. 9, 2004

Related U.S. Application Data

(62) Division of application No. 09/939,073, filed on Aug. 24, 2001, now Pat. No. 6,842,659.

(51) Int. Cl.
*H01L 21/00* (2006.01)
*H01L 21/66* (2006.01)

(52) U.S. Cl. .............................. 438/5; 438/14

(58) Field of Classification Search ................ 438/5–7, 438/2, 11, 14, 16–18, 38, 42, 44, 48, 50, 104, 438/178, 184, 224–226, 228, 388, 391, 424–426, 438/431, 439
See application file for complete search history.

(56) References Cited

U.S. PATENT DOCUMENTS

| | | | |
|---|---|---|---|
| 4,411,982 A | 10/1983 | Shibuya | |
| 5,719,495 A | 2/1998 | Mosiehi | |
| 5,791,969 A | 8/1998 | Lund | |
| 5,966,312 A | 10/1999 | Chen | |
| 6,010,962 A * | 1/2000 | Liu et al. | 438/687 |
| 6,110,011 A | 8/2000 | Somekh et al. | |
| 6,132,289 A | 10/2000 | Labunsky et al. | |
| 6,200,908 B1 | 3/2001 | Vandamme et al. | |
| 6,208,751 B1 | 3/2001 | Almogy | |
| 6,225,223 B1 * | 5/2001 | Liu et al. | 438/687 |
| 6,228,768 B1 * | 5/2001 | Woo et al. | 438/691 |
| 6,230,069 B1 | 5/2001 | Campbell et al. | |

(Continued)

FOREIGN PATENT DOCUMENTS

WO    WO 98/54632    12/1998

(Continued)

*Primary Examiner*—Michael Lebentritt
*Assistant Examiner*—Andre' Stevenson
(74) *Attorney, Agent, or Firm*—Patterson & Sheridan LLP

(57) ABSTRACT

A method and apparatus for performing intra-tool monitoring and control within a multi-step processing system. The method monitors the processing of a workpiece as the workpiece is processed by independently operating processing tools and produces control parameters for the various independently operating processing tools to optimize the processing of the workpiece. More specifically, the apparatus provides a metrology station located between each of a plurality of semiconductor wafer processing tools such that measurements can be made on wafers as they are passed from one tool to another providing intra tool monitoring. The data collected by the metrology station is coupled to a metrology data analyzer, which determines whether any of the plurality of wafer processing tools should be adjusted to improve the processing of the overall wafer. As such, the output of the metrology data analyzer provides control parameters to process controllers connected controllers connected to each of the tools within the semiconductor wafer processing system. Consequently, the operation of the metrology stations and the metrology data analyzer provides both feed forward and feed back data to control the tools based upon certain information that is gathered within the metrology station.

24 Claims, 3 Drawing Sheets

U.S. PATENT DOCUMENTS

| | | | | |
|---|---|---|---|---|
| 6,231,743 B1 * | 5/2001 | Etherington | | 205/83 |
| 6,433,561 B1 | 8/2002 | Satya | | |
| 6,444,481 B1 * | 9/2002 | Pasadyn et al. | | 438/5 |
| 6,489,240 B1 * | 12/2002 | Iacoponi et al. | | 438/687 |
| 6,610,151 B1 * | 8/2003 | Cohen | | 118/719 |
| 6,640,151 B1 * | 10/2003 | Somekh et al. | | 700/121 |
| 6,816,806 B1 * | 11/2004 | Kocimski | | 702/167 |
| 6,903,016 B1 * | 6/2005 | Cohen | | 438/687 |
| 2002/0192944 A1 * | 12/2002 | Sonderman et al. | | 438/637 |
| 2005/0084987 A1 * | 4/2005 | Wilson et al. | | 438/5 |

FOREIGN PATENT DOCUMENTS

WO    WO 99/15710    4/1999

* cited by examiner

METHOD AND APPARATUS FOR PROVIDING INTRA-TOOL MONITORING AND CONTROL

CROSS REFERENCE TO OTHER RELATED APPLICATIONS

This application is a division of patent application Ser. No. 09/939,073, filed Aug. 24, 2001 now U.S. Pat. No. 6,842,659, which is hereby incorporated by reference in its entirety.

BACKGROUND OF THE INVENTION

1. Field of the Invention

The present invention generally relates to semiconductor wafer processing systems and, more particularly, the invention relates to a method and apparatus for monitoring and controlling a plurality of tools within a semiconductor wafer processing system.

2. Description of the Related Art

Semiconductor wafer processing systems generally comprise a plurality of distinct tools for performing certain process steps on a wafer (or other form of substrate) to create integrated circuits (or other forms of micro-electronic circuits). Additional tools comprise metrology stations that are used for testing wafers in-between process steps. Generally, the metrology testing is performed to determine the specific accuracy and efficacy of the processes conducted by a particular tool. Depending upon the results of the metrology testing, certain parameters of a particular tool may be adjusted to facilitate improving the function of the tool. However, in such systems the metrology monitoring and control processing does not consider the interactions of multiple tools upon wafer processing. As such, the metrology station measuring wafers at the output of a first tool may determine that the wafers are within tolerances for the particular process conducted in the first tool, while the metrology station measuring wafers at the output of a second tool may find that those wafers are within tolerances for processing from the second tool. However, the combination of the inaccuracies in the first tool and the second tool may cause the processing of the wafer to inaccurately form integrated circuits on the wafer.

Therefore, there is a need in the art for a method and apparatus that provides intra-tool monitoring and control to more effectively process semiconductor wafers.

SUMMARY OF THE INVENTION

The present invention generally provides a method and apparatus for performing intra-tool monitoring and control within a multi-step processing system. The method monitors the processing of a workpiece as the workpiece is processed by independently operating processing tools and produces control parameters for the various independently operating processing tools to optimize the processing of the workpiece.

More specifically, the invention provides one or more metrology stations that can be used between processing steps of each tool in a plurality of tools such that measurements can be made on wafers as they are passed from one tool to another providing intra-tool monitoring. The data collected by the metrology station is coupled to a metrology data analyzer, which determines whether any of the plurality of wafer processing tools should be adjusted to improve the processing of the overall wafer. As such, the output of the metrology data analyzer provides control parameters to process controllers connected to each of the tools within the semiconductor wafer processing system. Consequently, the metrology station(s) and the metrology data analyzer provide both feed-forward and feedback data to control the tools based upon information that is gathered within the metrology station at specific instances in time or after particular process steps.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
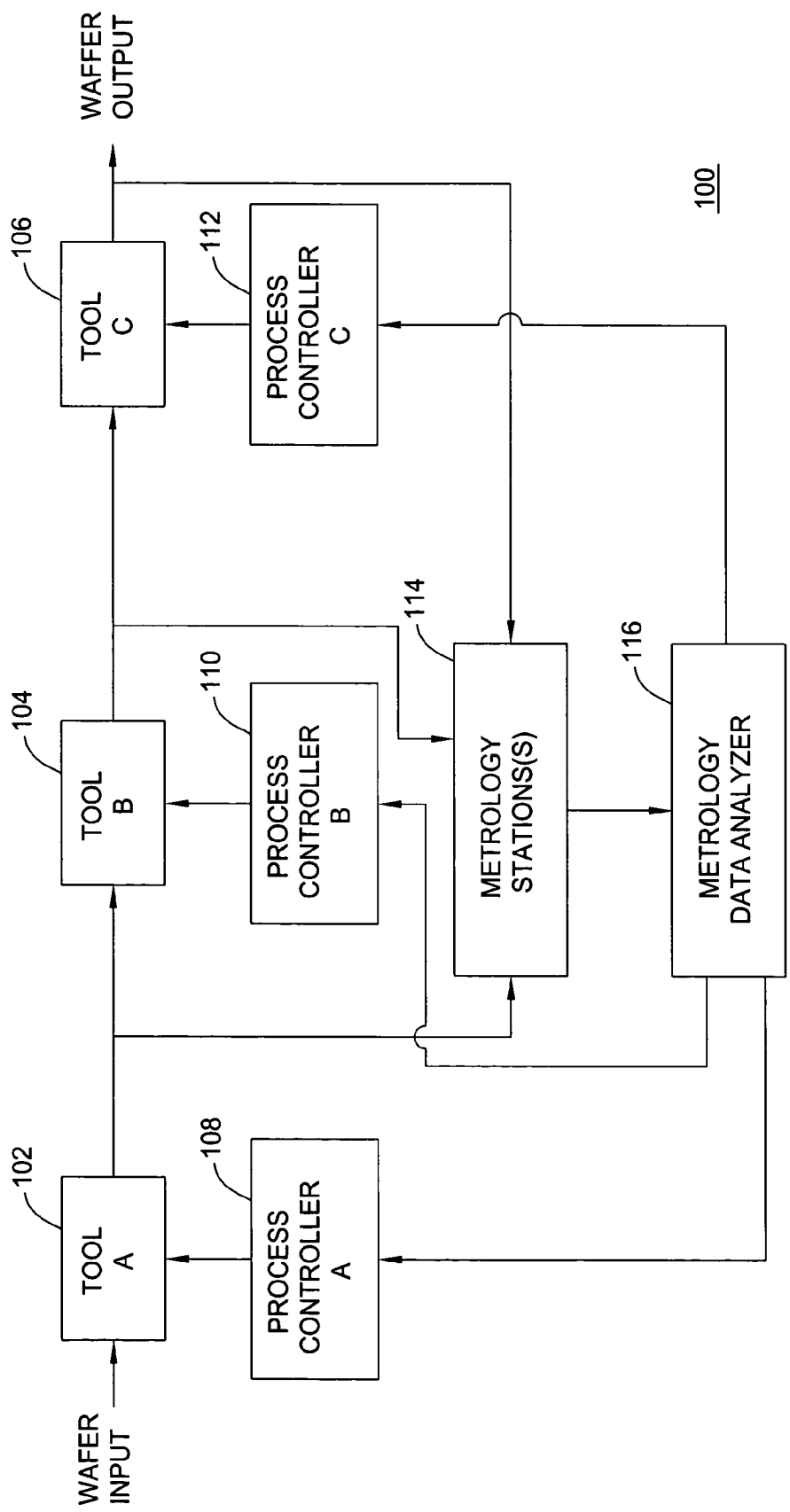
FIG. 1 is a block diagram of a semiconductor wafer processing system utilizing the present invention.

FIG. 1 depicts a block diagram of a semiconductor wafer processing system 100 comprising a plurality of tools 102, 104, 106 for processing semiconductor wafers in a serial manner, a plurality of processor controllers 108, 110, 112, one or more metrology stations 114 and a metrology data analyzer 116. Each process controller 108, 110, and 112 is respectively coupled to a tool 102, 104, and 106. In FIG. 1 (and FIG. 3 below) the thick arrows represent wafer movement and the thin arrows represent electrical signals or data signals. To process a wafer, a wafer is illustratively placed in tool A 102 and processed, then passed to tool B 104 and then to tool C 106. The completed wafer containing certain integrated circuits or intermediate structures for producing integrated circuits is output from tool C 106. Generally, the tools are independently operating tools such as etch chambers, electrochemical plating (ECP) cells, chemical-mechanical polishing (CMP) tools, and deposition chambers such as physical vapor deposition (PVD) and chemical vapor deposition (CVD).

Those skilled in the art will realize that the sequential ordering of the three tools shown in FIG. 1 is only illustrative of the invention and wafers during processing may be passed in both directions within the semiconductor wafer processing system or additional tools may be used within the system. Furthermore, the illustrative embodiments of the invention are described herein with respect to manufacturing integrated circuits on a semiconductor wafer. However, the invention is useful many other manufacturing environments where precise control of multi-step processing is required. Such manufacturing may include component machining, microelectronics fabrication, flat panel display fabrication, and the like. As such, the "wafer" in the following descriptions is one embodiment of a workpiece that is sequentially processed in various process steps to fabricate a product.

During intermediate process steps, wafers are removed from processing and placed in the metrology station(s) 114. Within the metrology station or stations 114, the wafers are measured to identify whether or not the layers, structures or features are within certain parameters. The wafer selected for the metrology station(s) may be certain types of test wafers such as blanket wafers or patterned wafers that are used for identifying certain anomalies that may occur as a result of processing by one or more of the tools. Alternatively, the wafers being tested may be selected from actual process wafers. Every process wafer or a subset may be tested.

The data from the metrology station(s) 114 is coupled to the metrology data analyzer 116. The metrology data is analyzed to determine if the tools 102, 104, 106 need to be adjusted to better process the wafers. The control signals from the metrology data analyzer 116 are coupled to the process controllers 108, 110, 112 for each tool 102, 104, 106 such that the metrology data analyzer 116 can use data collected from each tool to either feed-forward or feedback control signals to improve processing of the wafers.

Consequently, metrology station(s) 114 may find that tool A 102 is not correctly processing the wafer such that the metrology data analyzer 116 will feedback a signal to the process controller 108 for tool A 102 to correct the error before another wafer is processed. Additionally, the metrology station(s) 114 may also pass information to the metrology data analyzer 116 such that the process controller 110 for tool B 104 may be adjusted to compensate for the errors that were generated in tool A 102 and thus perform a feed-forward process for wafers that had already been processed incorrectly by tool A 102. In this manner, the invention provides an intra-tool monitoring and control system that can provide both feed-forward and feedback control of tools within a semiconductor wafer processing system.

The foregoing description describes the tools, processes controllers and metrology stations as being separate physical elements. In practical systems, the tools may be integrated with the process controllers and one or more metrology stations may be integrated into one or more of the tools.

Figure 2:
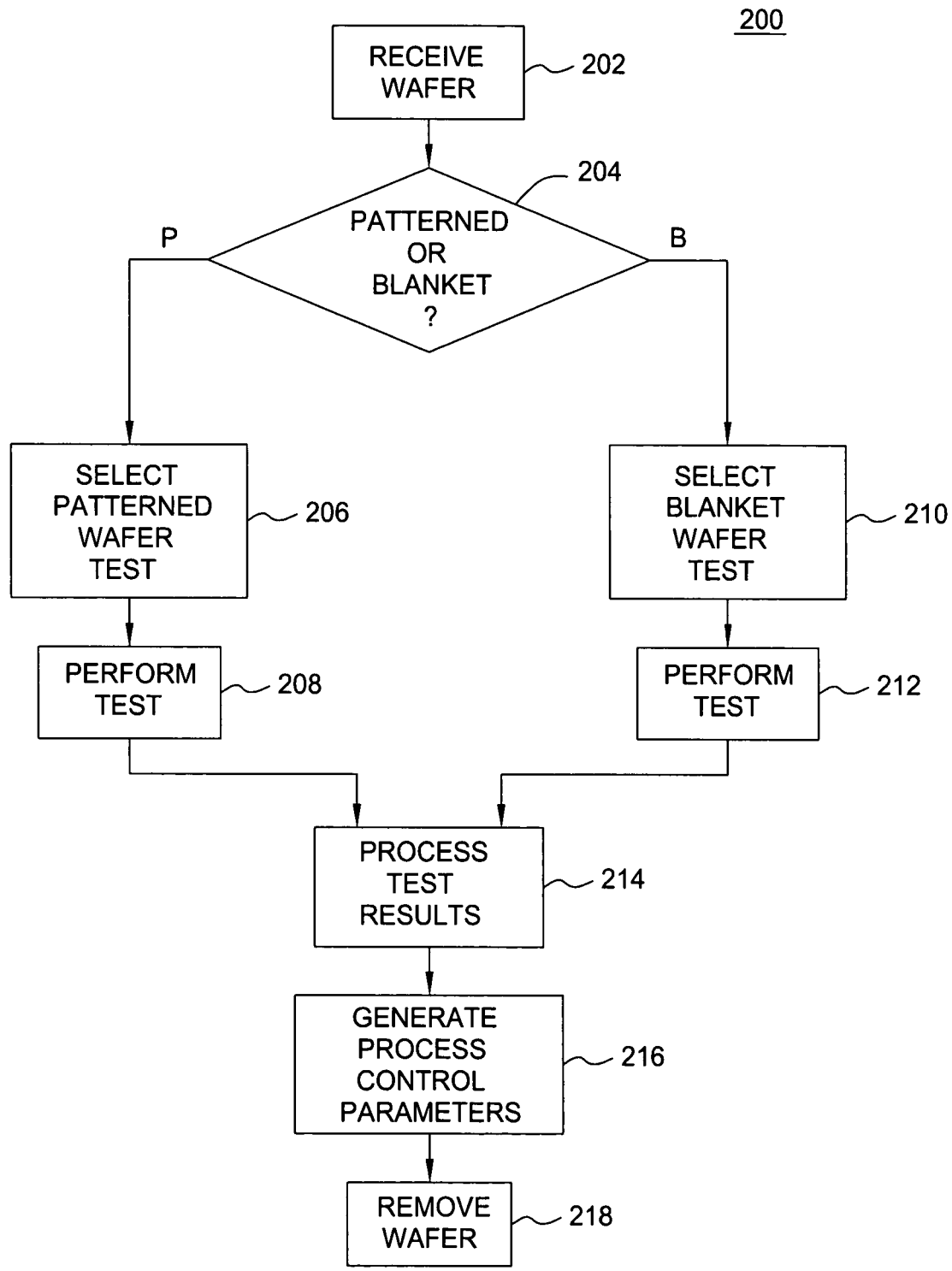
FIG. 2 is a flow diagram of a process in accordance with the present invention.

FIG. 2 depicts a flow diagram of an illustrative process 200 performed by the metrology station 114 and the metrology data analyzer 116. The process begins at step 202 when a wafer is received by a metrology station. At step 204, the method 200 queries whether the wafer requires metrology processing for patterned wafers or blanket wafers. A single wafer may have regions that are patterned and other regions that are blanket. As such, each region can be tested separately. If "patterned" is selected, the method proceeds to step 206 where one or more patterned wafer tests are selected to test the particular wafer. The selected patterned wafer test or tests depend on which tool processed the wafer in the last process step. At step 208, the selected patterned wafer test or tests are performed. If multiple tests are selected, each test is performed sequentially. Such patterned wafer testing includes:

1. Barrier seed step coverage of a trench and via having a specific size aspect ratio.
2. ECP gap fill based in a standard trench and via structure to detect voids.
3. ECP planarization in a particular trench/via structure.
4. CMP dishing and erosion in standard pattern structure (trenches with varying line width and spaces).
5. Copper thickness for various lines.
6. Trench depth after trench etch and dielectric constant after processing.
7. Residual metal on a comb structure.
8. Via or snake open in a standard structure—based on a voltage contrast or two-probe measurement.

If, at step 204, a blanket wafer is to be tested, then at step 210 the method 200 selects one or more blanket wafer tests. At step 212, the blanket wafer test(s) are performed. Blanket wafer tests include:

9. Barrier thickness.
10. Copper seed (CVD or PVD) thickness.
11. ECP copper thickness and bulk resistance.
12. Copper thickness.
13. Dielectric thickness, dielectric constant.
14. Defects such as particles, residue and systematic process defects.

Once the test results are produced, those test results are processed in step 214. At step 216, the method generates process control parameters for either feedback or feed-forward to the various process controllers. The process parameters may be changed to improve wafer processing. For example, in generating a barrier layer and a seed layer, the deposition process can be controlled by controlling power, pressure, bias, time of gas flows and the like to change the thickness or side wall coverage. In an electrochemical plating (ECP) gap fill process, the electroless thickness, patch thickness, current or pulse sequence, or additives to compensate for voids or planarization issues. In a chemical-mechanical polishing (CMP) process, the process can be controlled to minimize copper loss and achieve controlled thickness including controlling total pressure, radial pressure, slurry flow, rotation speed and time of CMP processing. Defects that are discovered in metrology testing can be controlled by eliminating some of the residue and particles produced in a prior process step by polishing or a longer cleaning period.

At step 218, the wafers removed from the metrology station and either discarded or moved to the next tool in the process sequence.

In one specific example, at step 202, each wafer is moved to a metrology station after ECP deposition of a copper layer. At steps 204, 210 and 212, the metrology station performs a blanket test to measure the thickness and uniformity of the copper layer. At step 214, the measurement results are processed to produce knowledge of the copper layer thickness a various locations on the wafer. At step 216, the process 200 generates control parameters for a CMP tool that will optimize the polishing of the copper layer with respect to the known thickness and uniformity. The control parameters include radial pressure profile (e.g., CMP pad pressure from center to edge) and the rotational speed of the polishing pad. At step 218, the polished wafer is moved to the next process tool.

Figure 3:
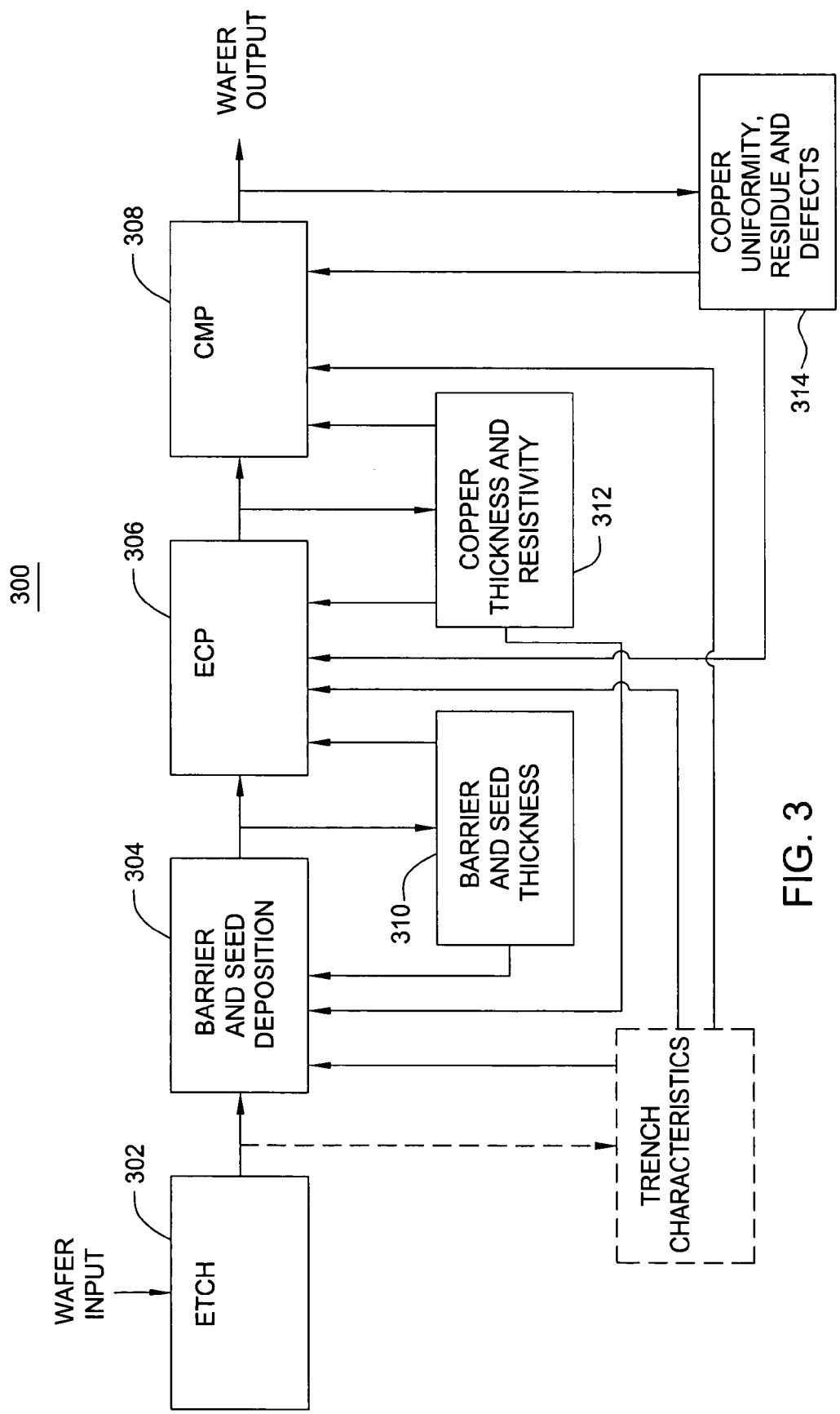
FIG. 3 depicts a flow diagram of a process for manufacturing a copper interconnect in accordance with the present invention.

FIG. 3 depicts a flow diagram of a method 300 representing a specific application of the invention in controlling the thickness of a copper interconnect. The process steps to be performed to produce a copper interconnect include etching a trench in the wafer (step 302), depositing a barrier layer of TaN and depositing a copper seed layer (step 304), depositing a copper layer (step 306) and then polishing the deposited copper back to the TaN (step 308) to form a copper interconnect in the trench.

After the barrier and seed layers are deposited, a metrology station measures the thickness of the layers at step 310. The results of the thickness measurements are used to produce control signals that are coupled to the deposition step 304 and the ECP step 306. In this manner, the barrier and seed layer deposition can be optimized for the next wafer and the ECP process can be used to compensate for anomalies in the seed layer thickness.

After ECP processing at step 306, the copper thickness and resistivity can be measured at step 312. The results are used to adjust the deposition step 304 and the ECP step 306 to correct any anomalies. The results are also used to control the CMP process 308. As such, if the copper thickness was not uniform after ECP step 306, the CMP step 308 can be used to correct the non-uniformity by adjusting the polishing rate, duration, slurry or other parameters.

Once the wafer exits the CMP step 308, metrology station measures the copper interconnect uniformity, residue remaining on the wafer and defects. The defects may be processed by a defect source identifier (as described in commonly assigned U.S. patent application Ser. No. 09/905,607, filed Jul. 13, 2001, or other know defect analysis system that can identify defect sources. This information is used to adjust the deposition step 304, the ECP step 306 and the CMP step 308 to optimize the processing of any new wafers as well as those in any intermediate step.

To further enhance the processing the deposition step 304 may be preceded by a metrology station measurement (step 316) that tests the geometry of the trench, e.g., depth, slope and the like. These measurements can be used to optimize any one or all of the following steps (e.g., steps 304, 306, and 308) in view of the trench geometry.

While the foregoing is directed to the preferred embodiment of the present invention, other and further embodiments of the invention may, be devised without departing from the basic scope thereof, and the scope thereof is determined by the claims that follow.

The invention claimed is:

1. A method of monitoring and controlling copper interconnect manufacturing processes within a multi-step copper interconnect manufacturing system having independently operating tools that perform specific processes upon a semiconductor wafer, wherein the tools include a barrier and seed layer deposition tool, a electrochemical plating tool and a chemical-mechanical polishing tool, comprising:
   depositing a barrier and seed layer within a trench formed in the semiconductor wafer;
   generating, in response to deposition results, first control parameters;
   performing electrochemical plating to deposit a copper layer upon the barrier and seed layer;
   generating, in response to plating results, second control parameters;
   polishing upon the copper layer;
   generating, in response to polishing results, third control parameters; and
   controlling at least one of the polishing process in response to the first control parameters or the deposition process in response to the third control parameters.

2. The method of claim 1 further comprising:
   etching the trench into the semiconductor wafer;
   testing a trench geometry;
   generating, in response to the trench geometry, fourth control parameters for the electrochemical plating tool, the barrier and seed layer deposition tool, and the chemical-mechanical polishing tool; and
   using the fourth control parameters to process the semiconductor wafer having the trench geometry.

3. The method of claim 1, wherein the step of controlling the polishing process comprises:
   controlling at least one of control radial pressure profile and the rotational speed of the polishing pad in response to at least one of the first, second or third control parameters.

4. The method of claim 1, wherein the step of controlling the polishing process further comprises:
   setting at least one of total pressure, radial pressure, slurry flow, rotation speed and time of CMP processing in response to at least one of the first, second or third control parameters.

5. The method of claim 1, wherein the step of controlling the depositing process further comprises:
   controlling at least one of power, pressure, bias, time of gas flows to change deposition thickness in response to at least one of the first, second or third control parameters.

6. The method of claim 1, wherein the step of controlling the plating process further comprises:
   controlling at least one of electroless thickness, patch thickness, current or pulse sequence, or additives to compensate for at least one of voids or planarization issues.

7. The method of claim 1 further comprising:
   obtaining gap fill information.

8. The method of claim 7 further comprising:
   tuning plating parameters of subsequently plated wafers in response to the gap fill information.

9. The method of claim 8, wherein the step of tuning plating parameters further comprises:
   controlling at least one of current density, rotation speed, and anode to wafer distance in response to the gap fill information.

10. The method of claim 7 further comprising:
    tuning polishing parameters of the wafer in response to the gap fill information.

11. The method of claim 1 further comprising:
    tuning processing parameters of subsequently process wafers in response to the control parameters.

12. The method of claim 1, wherein at least one of the results utilized to generate the control parameters are selected from the group consisting of barrier seed step coverage of a trench and via having a specific size aspect ratio, gap fill, void detection, planarization, dishing, erosion, copper thickness, trench depth, dielectric constant, residual metal on a comb structure, via or snake open in a standard structure based on a voltage contrast or two-probe measurement, barrier thickness, copper seed thickness, copper thickness, copper bulk resistance, dielectric thickness, dielectric constant, presence of particles, presence of residue and systematic process defects.

13. A method of monitoring and controlling copper interconnect manufacturing processes within a multi-step copper interconnect manufacturing system having independently operating tools that perform specific processes upon a semiconductor wafer, wherein the tools include a barrier and seed layer deposition tool, a electrochemical plating tool and a chemical-mechanical polishing tool, comprising:
    depositing a barrier and seed layer within a trench formed in the semiconductor wafer;
    testing a barrier and seed layer thickness;
    generating, in response to the barrier and seed layer thickness, first control parameters for the electrochemical plating tool and the barrier and seed layer deposition tool;
    performing electrochemical plating to deposit a copper layer upon the barrier and seed layer in accordance with the control parameters;

testing at least one of copper thickness and resistivity;
generating, in response to the testing at least one of copper thickness and resistivity, second control parameters for the electrochemical plating tool, the barrier and seed layer deposition tool, and the chemical-mechanical polishing tool;
performing chemical-mechanical polishing upon the copper layer in accordance with the second control parameters;
testing a copper uniformity and residue of the polished semiconductor wafer;
generating, in response to the copper uniformity and residue, third control parameters for the electrochemical plating tool, the barrier and seed layer deposition tool, and the chemical-mechanical polishing tool;
using the third control parameters in processing subsequent semiconductor wafers.

14. The method of claim 13 further comprising:
etching the trench into the semiconductor wafer;
testing a trench geometry;
generating, in response to the trench geometry, fourth control parameters for the electrochemical plating tool, the barrier and seed layer deposition tool, and the chemical-mechanical polishing tool; and
using the fourth control parameters to process the semiconductor wafer having the trench geometry.

15. The method of claim 13, wherein the step of controlling the chemical-mechanical polishing tool further comprises:
setting at least one of control radial pressure profile and the rotational speed of the polishing pad in response to at least one of the second or third control parameters.

16. The method of claim 13, wherein the step of controlling the chemical-mechanical polishing tool further comprises:
setting at least one of total pressure, radial pressure, slurry flow, rotation speed and time of CMP processing in response to at least one of the first or third control parameters.

17. The method of claim 13, wherein the step of controlling the deposition tool further comprises:
controlling at least one of power, pressure, bias, time of gas flows to change deposition thickness in response to at least one of the first, second or third control parameters.

18. The method of claim 13, wherein the step of controlling the electrochemical plating tool further comprises:
controlling at least one of electroless thickness, patch thickness, current or pulse sequence, or additives to compensate for at least one of voids or planarization issues.

19. The method of claim 13 further comprising:
obtaining gap fill information.

20. The method of claim 19 further comprising:
tuning plating parameters of subsequently plated wafers in response to the gap fill information.

21. The method of claim 20, wherein the step of tuning plating parameters further comprises:
controlling at least one of current density, rotation speed, and anode to wafer distance in response to the gap fill information.

22. The method of claim 19 further comprising:
tuning polishing parameters of the wafer in response to the gap fill information.

23. A method of monitoring and controlling copper interconnect manufacturing processes within a multi-step copper interconnect manufacturing system having independently operating tools that perform specific processes upon a semiconductor wafer, wherein the tools include a barrier and seed layer deposition tool, a electrochemical plating tool and a chemical-mechanical polishing tool, comprising:
depositing a barrier and seed layer within a trench formed in the semiconductor wafer;
generating, in response to deposition results, first control parameters;
performing electrochemical plating to deposit a copper layer upon the barrier and seed layer;
polishing upon the copper layer; and
controlling the polishing process in response to the first control parameters.

24. A method of monitoring and controlling copper interconnect manufacturing processes within a multi-step copper interconnect manufacturing system having independently operating tools that perform specific processes upon a semiconductor wafer, wherein the tools include a barrier and seed layer deposition tool, a electrochemical plating tool and a chemical-mechanical polishing tool, comprising:
depositing a barrier and seed layer within a trench formed in the semiconductor wafer;
performing electrochemical plating to deposit a copper layer upon the barrier and seed layer;
polishing upon the copper layer;
generating, in response to polishing results, first control parameters; and
controlling the deposition process in response to the first control parameters.

* * * * *